United States Patent
Ol

(10) Patent No.: US 7,468,635 B2
(45) Date of Patent: Dec. 23, 2008

(54) WIDEBAND DIGITAL SINGLE-TO-DIFFERENTIAL CONVERTER AND METHOD OF FORMING SAME

(75) Inventor: Yin Wah Ol, Tanjung Bungah (MY)

(73) Assignee: Motorola, Inc., Schaumburg, IL (US)

( * ) Notice: Subject to any disclaimer, the term of this patent is extended or adjusted under 35 U.S.C. 154(b) by 98 days.

(21) Appl. No.: 11/683,181

(22) Filed: Mar. 7, 2007

(65) Prior Publication Data

US 2008/0218272 A1    Sep. 11, 2008

(51) Int. Cl.
*H03F 3/04* (2006.01)
(52) U.S. Cl. .......................... 330/301; 330/69
(58) Field of Classification Search .................. 330/98, 330/69, 150, 252, 301, 310
See application file for complete search history.

(56) References Cited

U.S. PATENT DOCUMENTS

| | | | | |
|---|---|---|---|---|
| 6,400,224 B2 * | 6/2002 | Gharpurey | ................... | 330/252 |
| 7,126,419 B2 * | 10/2006 | Miyasita | ....................... | 330/69 |
| 7,279,982 B1 * | 10/2007 | Zhou et al. | ................... | 330/301 |

* cited by examiner

*Primary Examiner*—Henry K Choe

(57) ABSTRACT

A method and apparatus for single-to-differential conversion includes a single-to-differential stage (22), a phase balancing stage (24), and a buffer stage (26). The single-to-differential stage (22) converts a single input signal ($V_{clk}$) to a first and second output signal ($V_n$, $V_p$), where the first and second output signals ($V_n$, $V_p$) correspond to one another. The phase balancing stage (24) is electrically connected to the single-to-differential stage (22), balances and receives the first and second output signals ($V_n$, $V_p$), and outputs first and second balanced output signals ($V_+$, $V_-$). The buffer stage (26) is electrically connected to the phase balancing stage (24) for shaping the first and second balanced output signals ($V_+$, $V_-$). The single-to-differential converter (20) is operable over a substantially large bandwidth and achieves low-power consumption and good phase noise performance.

18 Claims, 3 Drawing Sheets

WIDEBAND DIGITAL SINGLE-TO-DIFFERENTIAL CONVERTER AND METHOD OF FORMING SAME

FIELD OF THE INVENTION

The present invention relates generally to an apparatus and method for single-to-differential conversion and more particularly to wideband digital single-to-differential converters for achieving good phase noise performance.

BACKGROUND

Differential signaling is a method of transmitting signals over a pair of wires for reducing the noise on an electrical connection by rejecting common-mode interference. Differential signaling is generally based upon the concept of a first wire carrying a first signal and a second wire carrying a second signal that is the inverse of the first signal. Thus, the sum of the voltages of the first and second wires is always constant. Typically, the first and second wires are close to one another so that they are subjected to the same interference.

A fully differential signal path is generally preferred in integrated analog circuitry, especially in high-frequency applications. One reason that utilizing a fully differential signal path is beneficial is due to its well-known properties of immunity to common-mode disturbances, rejection of parasitic couplings, and increased dynamic range. Often, it is necessary to convert a single signal to a differential signal to obtain these benefits. This can be done using a single-to-differential type converter.

In reference to FIG. 1, a prior art circuit diagram for a single-to-differential converter is generally shown at 10. The single-to-differential converter 10 has a first stage generally indicated at 12 and a second stage generally indicated at 14. A single-ended voltage signal $V_n$ is applied at the input of the first stage 12. The differential voltage signals $V_{out}$ are outputted by the first stage 12 and received by the second stage 14. The asymmetric effect due to the differential signal path of the first stage 12 is compensated in the second stage 14.

However, the reference current source $I_{ref}$ is sensitive to the noise of the supply and the variation of the tail current of $I_{ref}$ will increase the time delay jitter, which results in a reduction in the phase noise performance. The bandwidth of the single-to-differential converter 10 can be increased with higher quiescent currents. The maximizing of the gain for a given quiescent current requires an increase in the aspect ratio of transistor devices (M1 and M2) and/or the increase of load resistor $R_L$. However, the increase in the aspect ratio of M1 and M2 leads to an increase in output capacitance, which results in lower frequency response performance of the first stage 12. Further, larger load resistance of $R_L$ reduces the output swing due to the large voltage drops across it. Additionally, the single-to-differential converter 10 utilizing differential pair transconductance amplifiers results in difficulties in achieving wide-band performance in this design. Therefore, there is a trade-off amongst the gain, bandwidth, phase noise, and current consumption in the single-to-differential converter 10.

A software-defined radio (SDR) architecture generally requires wide-band support ranging from a few hundred mega-hertz to a few giga-hertz having a stringent phase noise performance offset with power consumption comparable to a single narrow-band architecture. As described herein, the single-to-differential converter 10 typically cannot operate at the above conditions. Therefore, the need exists to develop a single-to-differential stage that has a large bandwidth range and achieves low-power consumption with desirable phase noise performance.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
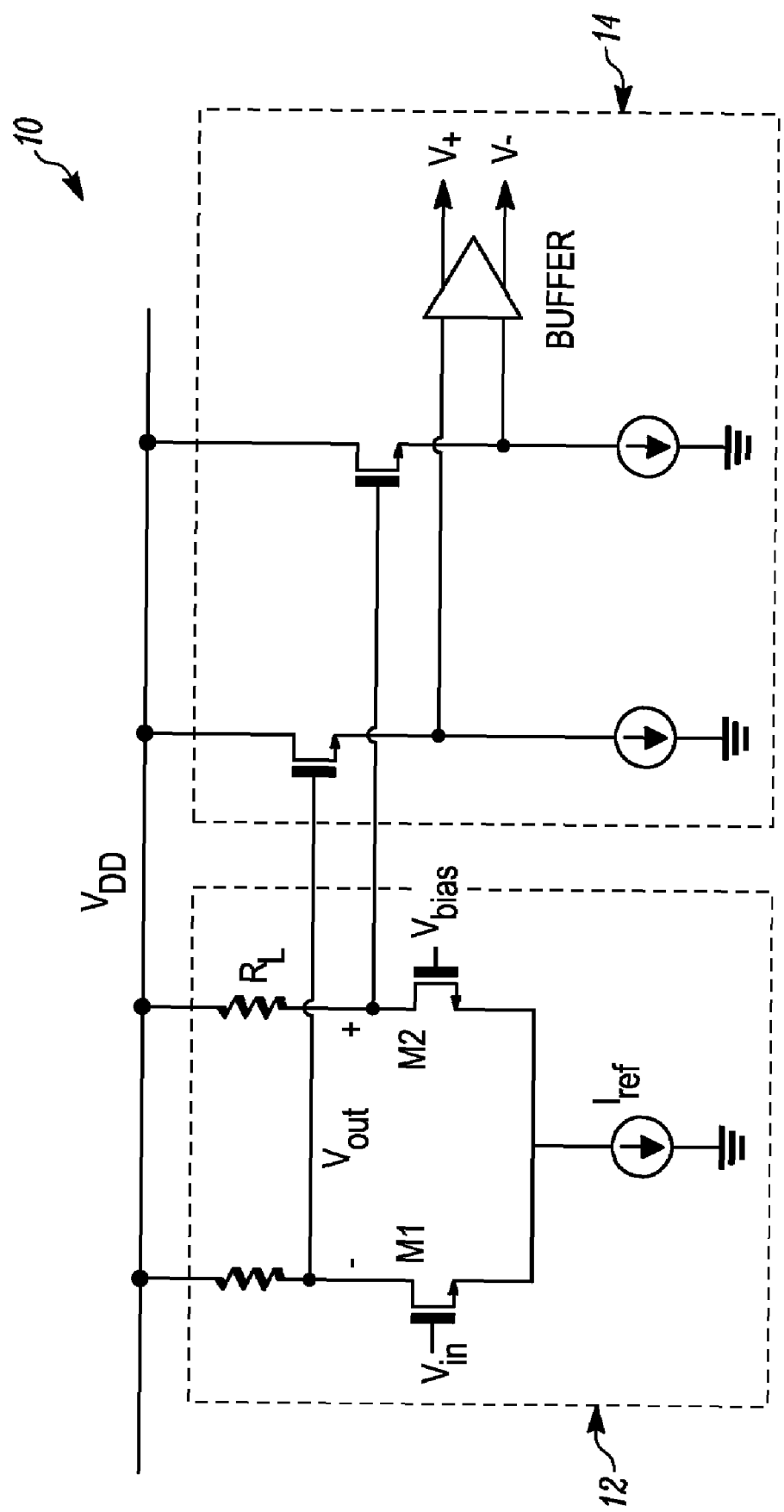
FIG. 1 is a circuit diagram of a prior art single-to-differential converter.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to single-to-differential conversion. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of the single-to-differential converter described herein. The non-processor circuits may include, but are not limited to, a radio receiver, a radio transmitter, signal drivers, clock circuits, power source circuits, and user input devices. As such, these functions may be interpreted as steps of a method to perform single-to-differential conversion. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Figure 2:
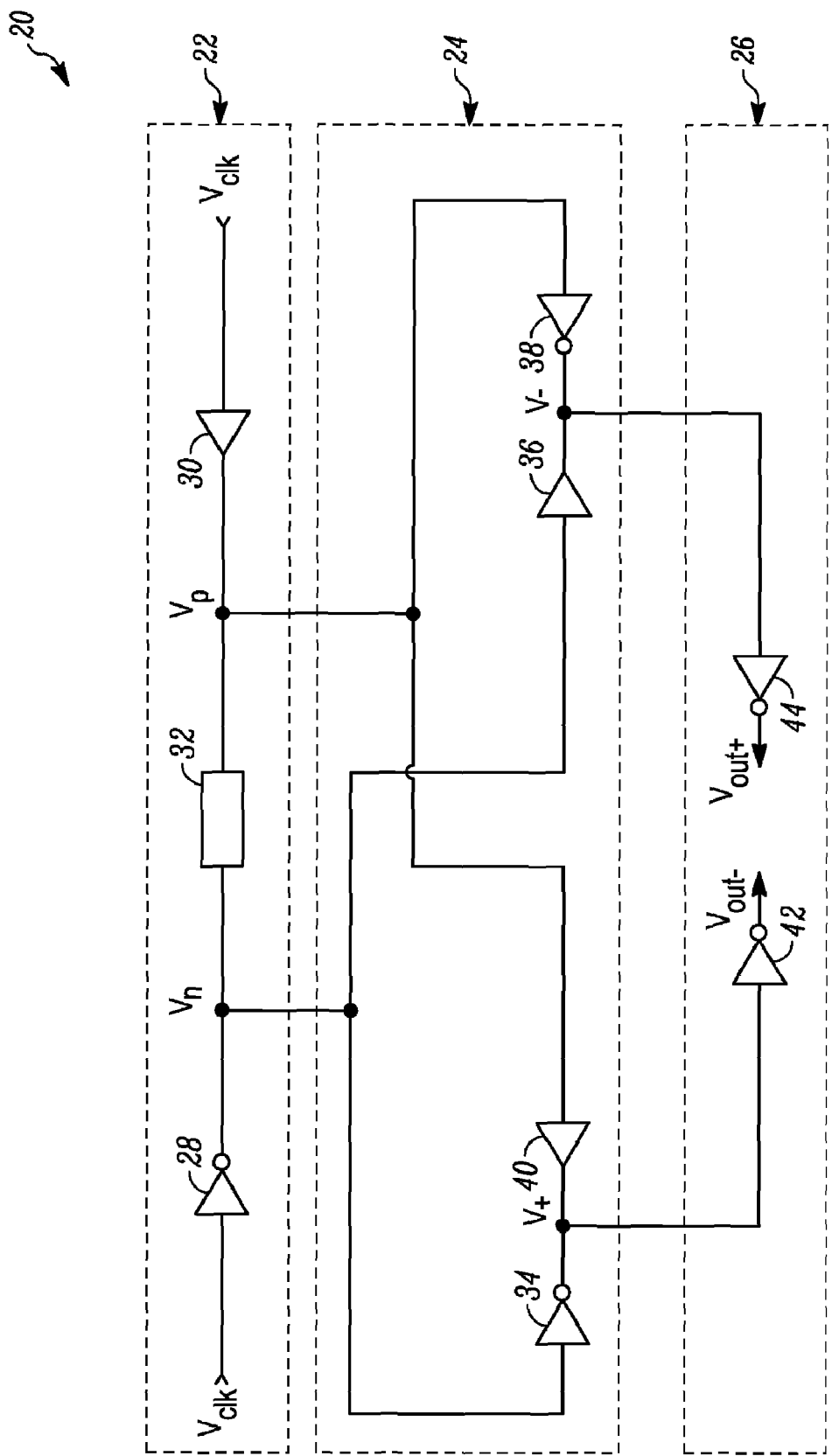
FIG. 2 is a block diagram illustrating a single-to-differential converter in accordance with an embodiment of the present invention.

In reference to FIG. 2, a block diagram of a single-to-differential converter 20 is illustrated in accordance with an embodiment of the present invention. The single-to-differential converter 20 includes a single-to-differential stage generally indicated at 22, a phase balancing stage generally indicated at 24, and a buffer stage generally indicated at 26. The single-to-differential stage 20 converts a single input signal $V_{clk}$ to a first output signal $V_n$ and a second output signal $V_p$. The first output signal $V_n$ and second output signal $V_p$ correspond to one another, such that the second output signal $V_p$ is the inverse of the first output signal $V_n$.

The phase balancing stage 24 is electrically connected to the single-to-differential stage 22. The phase balancing stage 24 receives and balances the phases of the first and second output signals $V_n$, $V_p$, and outputs a first balanced output signal $V_+$ and a second balanced output signal $V_-$. The first and second balanced output signals $V_+$,$V_-$ are corresponding, such that the second balanced output signal $V_-$ is the inverse of the first balanced output signal $V_+$.

The buffer stage 26 is electrically connected to the phase balancing stage 24. The buffer stage 26 shapes the first and second balance output signals $V_+$,$V_-$ to a predetermined shape, such as, but not limited to, a square wave. Typically, the buffer stage 26 is used to re-shape the first and second balanced output signals $V_+$,$V_-$ and outputs a first shaped and balanced output signal $V_{out+}$. The second shaped and balanced output signal $V_{out-}$ corresponds to the first shaped and balanced output signal $V_{out+}$, such that the second shaped and balanced output signal $V_{out-}$ is the inverse of the first shaped and balanced output signal $V_{out+}$.

The single-to-differential stage 22 comprises an inverter 28, a non-inverting amplifier 30, and a back-to-back inverter 32. The inverter 28 and non-inverting amplifier 30 receive a single input signal $V_{clk}$. The inverter 28 and non-inverting amplifier 30 generate an inverted and a non-inverted replica of the input clock signal, respectively. Typically, the non-inverting replica of the input clock signal $V_{clk}$ has poor rail-to-rail performance. The back-to-back inverter 32 is used to push the non-inverting replica $V_p$ of the input clock signal $V_{clk}$ to achieve rail-to-rail swing. Thus, the phase balancing stage 24 outputs the first and second output signals $V_n$,$V_p$, which are asymmetric and not balanced.

The phase balancing stage 24 comprises a weak-drive inverter 34, a weak-drive non-inverting amplifier 36, a strong-drive inverter 38, and a strong-drive non-inverting amplifier 40. Typically, the first output signal $V_n$ is faster than the second output signal $V_p$. Thus, the first output signal $V_n$ is connected to the weak-drive inverter 34 and the weak-drive non-inverting amplifier 36. The slower second output signal $V_p$ is connected to the strong-drive inverter 38 and the strong-drive non-inverting amplifier 40. The weak-drive inverter 34 and the strong-drive non-inverting amplifier 40 output a first balanced output signal $V_+$. Additionally, the weak-drive non-inverting amplifier 36 receives the first output signal $V_n$ and the strong-drive inverter 38 receives the second output signal $V_p$. The weak-drive non-inverting amplifier 36 and the strong-drive inverter 38 output a second balanced output signal $V_-$. The first and second balanced output signals $V_+$,$V_-$ of the phase balancing stage 24 are symmetric and balanced, and thus, generate equal drivability. Typically, the aspect ratio of the inverters 34,38 and non-inverting amplifiers 36,40 are predetermined in order to balance the first and second balanced output signals $V_+$,$V_-$.

The buffer stage 26 comprises a first inverter 42 and a second inverter 44. The first inverter 42 receives the first balanced output signal $V_+$ from the phase balancing stage 24. The second inverter 44 receives the second balanced output signal $V_-$ from the phase balancing stage 24. The first inverter 42 and second inverter 44 re-shape the waves of the first balanced output signal $V_+$ and second balanced output signal $V_-$. The first inverter 42 outputs the first balanced and shaped output signal $V_{out-}$. The second inverter 44 outputs the second balanced and shaped output signal $V_{out+}$. The first and second balanced and shaped output signals $V_{out-}$,$V_{out+}$ are corresponding, such that $V_{out-}$ is the inverse of output signal $V_{out+}$. Typically, the first and second balanced and shaped output signals $V_{out-}$,$V_{out+}$ are re-shaped to a square wave.

By way of explanation and not limitation, all of the above inverters 28, 34, 38, 42, 44 and non-inverting amplifiers 30, 36, 40 can be complementary metal oxide semiconductor (CMOS) gates. By utilizing the CMOS digital gates, the single-to-differential converter 20 can be interchanged with other circuits easily, since the supply voltage can be scaled down with the CMOS process technology. However, those skilled in the art will recognize that other suitable inverters or non-inverting amplifiers could be used.

By way of explanation and not limitation, the single-to-differential converter 20 can be used in software-defined radio (SDR) architecture due to its smaller current consumption, as compared to transconductance amplifier converters, which require the large tail current in order to achieve the phase noise performance. Additionally, the single-to-differential converter 20 has desirable operating characteristics for SDR architecture, such as, but not limited to, a very good duty cycle and differential phase shift error. Also, the single-to-differential converter 20 can achieve stringent phase noise performance of approximately −155 dBc/Hz at 1 MHz offset with about 3.2 mW of power being consumed using about 1.8V supply voltage. Further, the single-to-differential converter 20 has a wide-band design from a few mega-hertz to a few giga-hertz. Typically, the upper limit operating frequency of the single-to-differential converter 20 is limited by the cut-off frequency of the devices in a particular process technology used, such as, but not limited to, the SDR architecture or the like.

Figure 3:
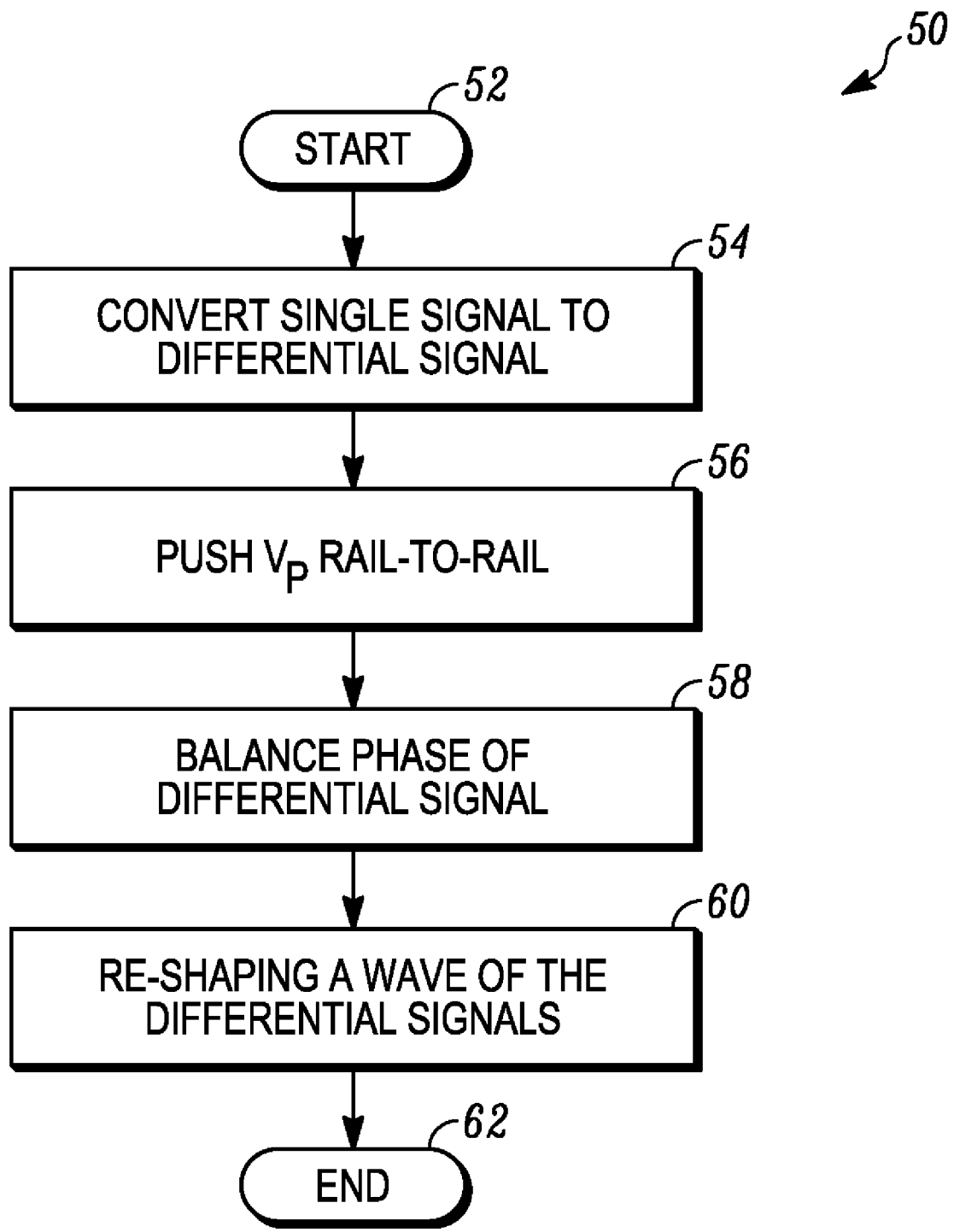
FIG. 3 is flow chart diagram illustrating an example of a single-to-differential converting method in accordance with an embodiment of the present invention.

In reference to both FIGS. 2 and 3, a method for a single-to-differential conversion of a signal is generally indicated at 50. The method 50 begins at step 52 and proceeds to step 54, where a single signal is converted to a differential signal in the single-to-differential stage 22. Thus, the single-to-differential stage 20 outputs the first and second output signals $V_n$,$V_p$, where the second output signal $V_p$ has poor rail-to-rail performance. Next, at step 56, the output signal $V_p$ is pushed rail-to-rail.

The method 50 then proceeds to step 58, where the phase of the first and second output signals $V_n, V_p$ are balanced by the phase balancing stage 24. Additionally, this generates equal drivability of the first and second output signals $V_n, V_p$. The phase balancing stage 24 outputs first and second balanced output signals $V_+, V_-$.

Next, the wave of the differential signals is reshaped by the buffer stage 26, at step 60. The method 50 ends at step 62. By way of explanation and not limitation, the method 50 can produce an acceptable phase noise performance at approximately −155 dBc/Hz. The method 50 can also provide a bandwidth from a few mega-hertz to a few giga-hertz, depending on the process technology used. The smaller the process technology, the higher the upper limit operating frequency. For example, and in no way limiting, the bandwidth provided by the method 50 is in a range of approximately 100 MHz to 3 GHz in 0.18 micro meters (μm) CMOS process technology.

Thus, the present invention is directed to a single-to-differential converter 20 the includes a single-to-differential stage 22 for converting a single input signal $V_{clk}$ to a first and second corresponding output signals $V_n, V_p$. A phase balancing stage 24 receives and balances the phases of the output signals $V_n, V_p$ which are then directed to a buffer stage 26 that is used with the phase balancing stage 24 for shaping the balanced output signals $V_+, V_-$ and outputting the first and second balanced and shaped outputs $V_{out-}, V_{out+}$. The invention is advantageous since it easily implemented in CMOS providing a low phase noise and current drain.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A single-to-differential converter comprising:
a single-to-differential stage that converts a single input signal to a first output signal and a second output signal, wherein the first and second output signal correspond to one another and wherein the single-to-differential stage comprises an inverter, a non-inverting amplifier, and a back-to-back inverter, wherein the inverter and the non-inverting amplifier receive the single input signal;
a phase balancing stage electrically connected to the single-to-differential stage, wherein the phase balancing stage receives and balances the phases of the first and second output signals and outputs corresponding first balanced output signal and a second balanced output signal; and
a buffer stage electrically connected to the phase balancing stage for shaping the first and second balanced output signals.

2. The converter of claim 1, wherein the inverter and the back-to-back inverter output the first output signal.

3. The converter of claim 1, wherein the non-inverting amplifier and the back-to-back inverter output the second output signal.

4. The converter of claim 1, wherein the phase balancing stage comprises a weak-drive inverter electrically connected to a strong-drive non-inverting amplifier and a weak-drive non-inverting amplifier electrically connected to a strong-drive inverter.

5. The converter of claim 4, wherein the weak-drive inverter receives the first output signal and the strong-drive non-inverting amplifier receives the second output signal, and the weak-drive inverter and the strong-drive non-inverting amplifier output the first balanced output signal.

6. The converter of claim 4, wherein the weak-drive non-inverting amplifier receives the first output signal and the strong-drive inverter receives the second output signal, and the weak-drive non-inverting amplifier and the strong-drive inverter output the second balanced output signal.

7. The converter of claim 1, wherein the buffer stage comprises a first inverter and a second inverter, wherein the first inverter receives the first balanced output signal from the phase balancing stage and the second inverter receives the second balanced output signal from the phase balancing stage.

8. A single-to differential converter comprising:
a single-to-differential stage including at least an inverter, a non-inverting amplifier, and a back-to-back inverter, wherein the inverter and non-inverting amplifier receive a single input signal and the single-to-differential stage converts the single input signal to corresponding first and second output signals;
a phase balancing stage electrically connected to the single-to-differential stage, including at least a weak-drive inverter electrically connected to a strong-drive non-inverting amplifier and a weak-drive non-inverting amplifier electrically connected to a strong-drive inverter, wherein the phase balancing stage receives and balances the first and second output signals and outputs corresponding first and second balanced output signals; and
a buffer stage including at least a first and second inverter for shaping the first and second balanced output signals, wherein the buffer stage is electrically connected to the phase balancing stage.

9. The converter of claim 8, wherein the inverter and the back-to-back inverter of the single-to-differential stage output the first output signal.

10. The converter of claim 8, wherein the non-inverting amplifier and the back-to-back inverter of the single-to-differential stage output the second output signal.

11. The converter of claim 8, wherein the weak-drive inverter receives the first output signal and the strong-drive non-inverting amplifier receives the second output signal, and the weak-driver inverter and the strong-drive non-inverting amplifier output a first balanced output signal.

12. The converter of claim 8, wherein the weak-drive non-inverting amplifier receives the first output signal and the strong-drive inverter receives the second output signal, and the weak-drive non-inverting amplifier and the strong-drive inverter output a second balanced output signal.

13. The converter of claim 8, wherein the first inverter of the buffer stage receives the first balanced output signal and the second inverter of the buffer stage receives the second balanced output signal.

14. The converter of claim 8, wherein all of the inverters and the non-inverting amplifiers are CMOS gates.

15. A method for single-to-differential conversion of a signal, the method comprising the steps of:
- converting a single input signal to differential signals, wherein the differential signals have at least a first signal and a second signal that correspond to one another and pushing one of the differential signals rail-to-rail when converting the single input single to the differential signals;
- balancing a phase of the differential signals such that the first signal is symmetrical with the second signal; and
- re-shaping a wave of the first signal and the second signal of the differential signals.

16. The method of claim 15 further comprising the step of generating equal drivability of the differential signals when balancing the phase of the differential signals.

17. The method of claim 15 further comprising the step of providing phase noise performance at approximately −155 dBc/Hz at approximately 1 MHz offset.

18. The method of claim 15 further comprising the step of providing a bandwidth in a range of approximately 100 MHz to 3 GHz.

* * * * *

UNITED STATES PATENT AND TRADEMARK OFFICE
CERTIFICATE OF CORRECTION

PATENT NO.        : 7,468,635 B2                                              Page 1 of 1
APPLICATION NO.   : 11/683181
DATED             : December 23, 2008
INVENTOR(S)       : Yin Wan Ol It is certified that error appears in the above-identified patent and that said Letters Patent is hereby corrected as shown below:

Title page item

"(75) Inventor:    Yin Wah Ol, Tanjung Bungah (MY)"

please change to

--(75) Inventor:    Yin Wan Ol, Tanjung Bungah (MY)--

Signed and Sealed this

Twenty-fifth Day of August, 2009

David J. Kappos
*Director of the United States Patent and Trademark Office*